(12) United States Patent
Jin et al.

(10) Patent No.: US 12,733,522 B2
(45) Date of Patent: Sep. 8, 2026

(54) SEMICONDUCTOR DEVICES METHODS OF MANUFACTURING SEMICONDUCTOR DEVICES

(71) Applicant: Amkor Technology Singapore Holding Pte. Ltd., Singapore (SG)

(72) Inventors: Sang Hyun Jin, Incheon (KR); Hyun Goo Cha, Incheon (KR); Yun Kyung Jeong, Incheon (KR); Jin Suk Jeong, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 485 days.

(21) Appl. No.: 18/231,498

(22) Filed: Aug. 8, 2023

(65) Prior Publication Data

US 2025/0054853 A1 Feb. 13, 2025

(51) Int. Cl.
*H10W 70/65* (2026.01)
*H10W 70/05* (2026.01)
(Continued)

(52) U.S. Cl.
CPC ........... *H10W 70/65* (2026.01); *H10W 70/05* (2026.01); *H10W 70/095* (2026.01);
(Continued)

(58) Field of Classification Search
CPC ........... H01L 23/49838; H01L 21/4857; H01L 21/486; H01L 23/145; H01L 23/3128; H01L 23/49816; H01L 23/49822; H01L 23/49833; H01L 23/49866; H01L 24/08; H01L 24/16; H01L 24/32; H01L 24/73; H01L 25/0655; H01L 2224/08235; H01L 2224/16227; H01L 2224/16238; H01L 2224/32225; H01L 2224/73204; H01L 2924/1616; H01L 2924/16235;
(Continued)

(56) References Cited

U.S. PATENT DOCUMENTS 6,713,381 B2 * 3/2004 Barr .................. H01L 21/76849
257/E21.585
6,930,256 B1 8/2005 Huemoeller et al.
(Continued)

OTHER PUBLICATIONS

Office Action for Taiwan Application No. 111119534 mailed Feb. 5, 2026.

*Primary Examiner* — Douglas W Owens
(74) *Attorney, Agent, or Firm* — Spectrum IP Law Group LLC

(57) ABSTRACT

In one example, a semiconductor device comprises a first dielectric comprising a first side and a second side, a first conductive tier in the first dielectric and comprising a first conductive path integral with a first conductive via, wherein the first conductive path and the first conductive via extend between the first side and the second side of the first dielectric, a second dielectric comprising a first side and a second side, and a first barrier covering the first conductive tier and covering the first dielectric, wherein the first barrier is between the second side of the first dielectric and the first side of the second dielectric. The first conductive tier comprises a trench barrier coupled with the first dielectric structure. Other examples and related methods are also disclosed herein.

19 Claims, 13 Drawing Sheets

(51) Int. Cl.

| | |
|---|---|
| ***H10W 70/66*** | (2026.01) |
| ***H10W 70/685*** | (2026.01) |
| ***H10W 70/695*** | (2026.01) |
| ***H10W 74/10*** | (2026.01) |
| ***H10W 74/15*** | (2026.01) |
| ***H10W 90/00*** | (2026.01) |

(52) U.S. Cl.

CPC ......... *H10W 70/66* (2026.01); *H10W 70/685* (2026.01); *H10W 70/695* (2026.01); *H10W 74/117* (2026.01); *H10W 90/00* (2026.01); *H10W 90/401* (2026.01); *H10W 90/701* (2026.01); *H10W 74/15* (2026.01); *H10W 90/724* (2026.01); *H10W 90/734* (2026.01); *H10W 90/794* (2026.01)

(58) Field of Classification Search

CPC ..... H01L 2924/16251; H01L 23/49811; H01L 23/3121; H01L 21/56; H01L 21/76895; H01L 23/481; H01L 23/485; H01L 23/041; H01L 23/3157; H01L 23/482; H01L 23/49894; H01L 23/5383; H01L 23/5386; H10W 70/65; H10W 70/05; H10W 70/095; H10W 70/66; H10W 70/685; H10W 70/695; H10W 74/117; H10W 90/00; H10W 90/401; H10W 90/701; H10W 74/15; H10W 90/724; H10W 90/734; H10W 90/794; H10W 20/0698; H10W 20/20; H10W 20/40; H10W 74/01; H10W 74/114; H10W 70/69; H10W 74/131; H10W 76/161

See application file for complete search history.

(56) References Cited

U.S. PATENT DOCUMENTS

| | | | | |
|---|---|---|---|---|
| 11,024,577 | B1 * | 6/2021 | Park | H01L 23/5252 |
| 2009/0085172 | A1 * | 4/2009 | Horigome | C23C 16/347<br>700/121 |
| 2010/0078820 | A1 * | 4/2010 | Kurokawa | H01L 23/53238<br>257/E23.161 |
| 2010/0081271 | A1 * | 4/2010 | Ishizaka | H01L 21/76856<br>438/622 |
| 2010/0136781 | A1 | 6/2010 | Kulkarni et al. | |
| 2012/0155055 | A1 | 6/2012 | Kang et al. | |
| 2012/0322261 | A1 | 12/2012 | Shue et al. | |
| 2015/0249038 | A1 * | 9/2015 | Xu | H01L 21/76843<br>438/653 |
| 2015/0270166 | A1 * | 9/2015 | Matsumoto | H01L 21/67207<br>438/635 |
| 2016/0268199 | A1 | 9/2016 | Lee et al. | |
| 2017/0229358 | A1 | 8/2017 | Ill et al. | |
| 2020/0043908 | A1 | 2/2020 | Chung et al. | |
| 2021/0057303 | A1 | 2/2021 | Chen et al. | |
| 2022/0037202 | A1 * | 2/2022 | Lin | H01L 21/76885 |
| 2022/0077078 | A1 | 3/2022 | Jeong et al. | |
| 2022/0384323 | A1 | 12/2022 | Jin et al. | |
| 2022/0393105 | A1 * | 12/2022 | Leng | H10N 70/245 |
| 2023/0021192 | A1 * | 1/2023 | Leng | H10D 84/40 |
| 2023/0121621 | A1 | 4/2023 | Jin et al. | |
| 2023/0307294 | A1 * | 9/2023 | Ma | H01L 21/3212 |
| 2023/0345735 | A1 * | 10/2023 | Leng | H10D 1/043 |

* cited by examiner 120
110
122
121
171C
170C 120
110
130a
122
121
171C
170C 120
110
130a
1300
171C
170C 120
110
130
130c
130b
130d
130a
171C
170C 120
110
150
130c
130
130b
130a
130d
121
122
171C
170C 120
110
150
130c
130
130d
130b
130a
121
122
171C
130a
170C
122
121

120
110
150
130c
130
130d
130b
130a
1300
121
122
171C
130a
170C
122
121

130e
150
160
130d
130c
110
130b
171C
170C
130a
120
130

140a
140b 100B
130e
150
160B
140a
140b
140
130d
130c
110
130b
171C
170C
130a
120
130

100C
160C
170C
171C
180C
130d
110
150
130e
140
140b
140a
130c
130b
130a
120
130

SEMICONDUCTOR DEVICES METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figures 1, 2A:
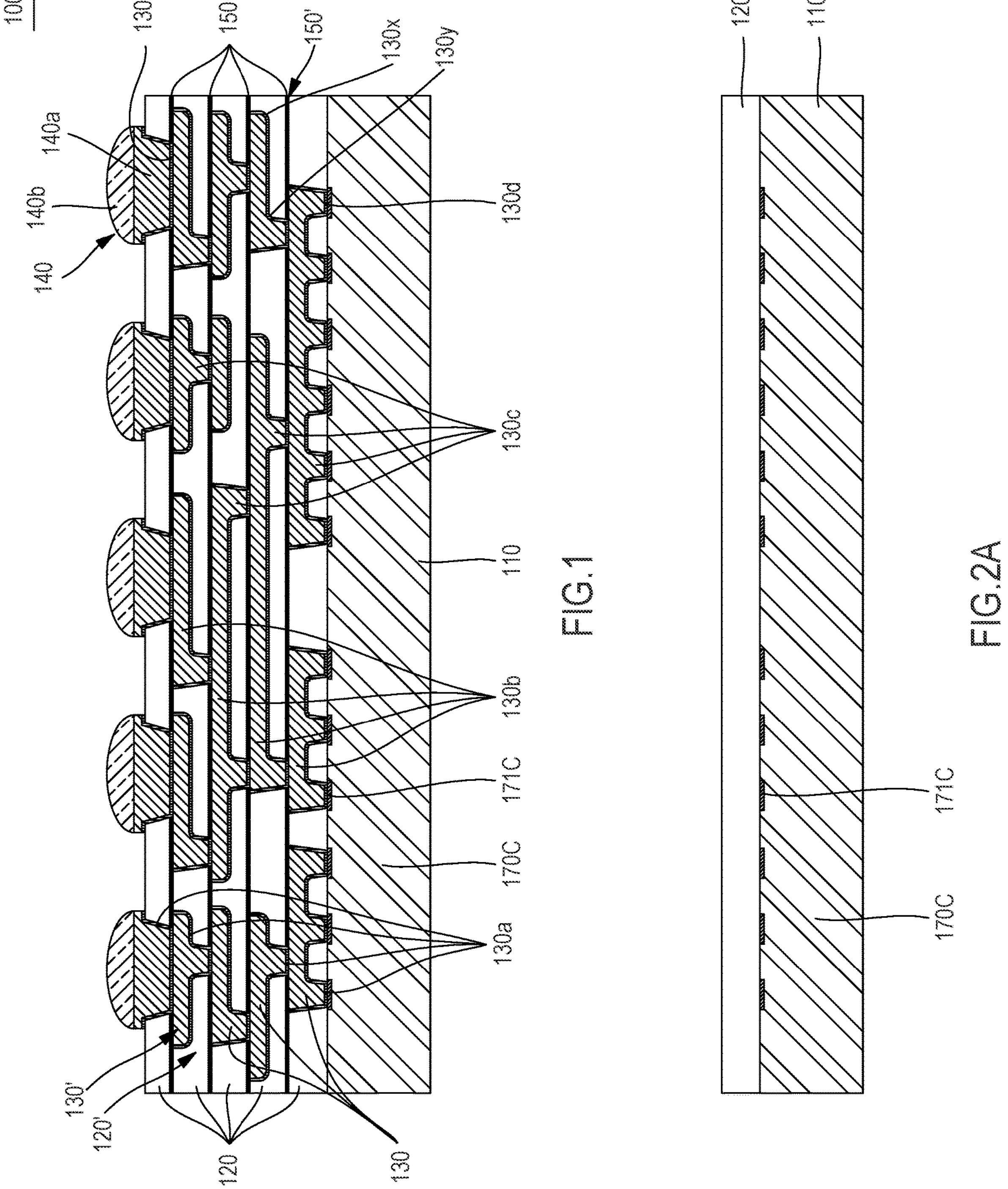
FIG. 1 shows a cross-sectional view of an example electronic component.
FIGS. 2A to 2S show cross-sectional views of an example method for manufacturing an example electronic component.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features. The terms "first," "second," etc. may be used herein to describe various elements, and these elements should not be limited by these terms. These terms are used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a first dielectric comprising a first side and a second side, a first conductive tier in the first dielectric and comprising a first conductive path integral with a first conductive via, wherein the first conductive path and the first conductive via extend between the first side and the second side of the first dielectric, a second dielectric comprising a first side and a second side, and a first barrier covering the first conductive tier and covering the first dielectric, wherein the first barrier is between the second side of the first dielectric and the first side of the second dielectric. The first conductive tier comprises a trench barrier coupled with the first dielectric.

In another example, a semiconductor device comprises a first dielectric comprising a first side and a second side, a first conductive tier comprising a first conductive path integral with a first conductive via, wherein the first conductive path and the first conductive via extend between the first side and the second side of the first dielectric, a second dielectric comprising a first side and a second side, a second conductive tier comprising a second conductive path integral with a second conductive via, wherein the second conductive path and the second conductive via extend between the first side and the second side of the second dielectric, a first barrier between the second side of the first conductive tier and the first side of the second dielectric, a first electronic component coupled with the second conductive tier, and a first encapsulant coupled with the second dielectric and covering a lateral side of the first electronic component. The second conductive tier is coupled with the first conductive tier through an opening in the first barrier.

In a further example, a method to manufacture a semiconductor device comprises providing a substrate comprising a first side and a second side, providing a first dielectric comprising a first side and a second side, wherein the first side of the first dielectric is coupled with the second side of the substrate, providing a first conductive tier in the first dielectric and comprising a first conductive path integral with a first conductive via, wherein the first conductive path and the first conductive via extend between the first side of the first dielectric and the second side of the first dielectric, providing a first barrier covering the first conductive tier and covering the second side of the first dielectric, and providing a second dielectric comprising a first side and a second side, wherein the first side of the second dielectric is coupled with the second side of the first dielectric. The first barrier is between the second side of the first dielectric and the first side of the second dielectric.

Other examples are included in the present disclosure. Such examples may be found in the figures, in the claims, or in the description of the present disclosure.

FIG. 1 shows a cross-sectional view of an example electronic component 100. In the example shown in FIG. 1, electronic component 100 can comprise substrate 110, dielectric structure 120', conductive structure 130', outer interconnects 140, and barrier structure 150'. Dielectric structure 120' can comprise one or more dielectrics 120 that can be vertically stacked. Conductive structure 130' can comprise one or more conductive tiers 130 that can be vertically stacked. Barrier structure 150' can comprise one or more barriers 150 that can extend between adjacent dielectrics 120. Barriers 150 can cover portions of conductive layers 130 and can extend between such portions and an adjacent dielectric 120.

Conductive tier 130 can be in dielectric 120 between a top side of dielectric 120 and a bottom side of dielectric 120. Conductive tier 130 can comprise seed 130*a* comprising one or more seed layers, conductive paths 130*b*, conductive vias 130*c*, inward terminals 130*d*, or outward terminals 130*e*. In some examples, seed 130*a* can comprise or can be referred to as trench barrier 130*a*. Trench barrier 130*a* can be coupled with its surrounding dielectric 120. In some examples, conductive paths 130*b* can comprise or refer to traces, pads, or other conductive patterns. Conductive paths 130*b* can be integral with conductive vias 130*c*. In some examples, conductive tier 130 can comprise an arcuate vertex 130*x* between a lateral side of conductive path 130*b* and a horizontal side of conductive path 130*b*, or an arcuate vertex 130*y* between a horizontal side of conductive path 130*b* and a vertical side of conductive via 130*c*. Outer interconnect 140 can comprise contact pad 140*a* and terminal tip 140*b*.

Dielectric structure 120', conductive structure 130', outer interconnects 140, and barrier structure 150' can be referred to as a semiconductor package and the package can provide protection for substrate 110 from external elements or environmental exposure. The semiconductor package can provide electrical coupling between external electrical components and outer interconnect 140 or substrate 110. In some examples, electronic device 100 can comprise electronic component 170C. In some examples, electronic component 170C can comprise component interconnect 171C.

Figures 2B, 2C:
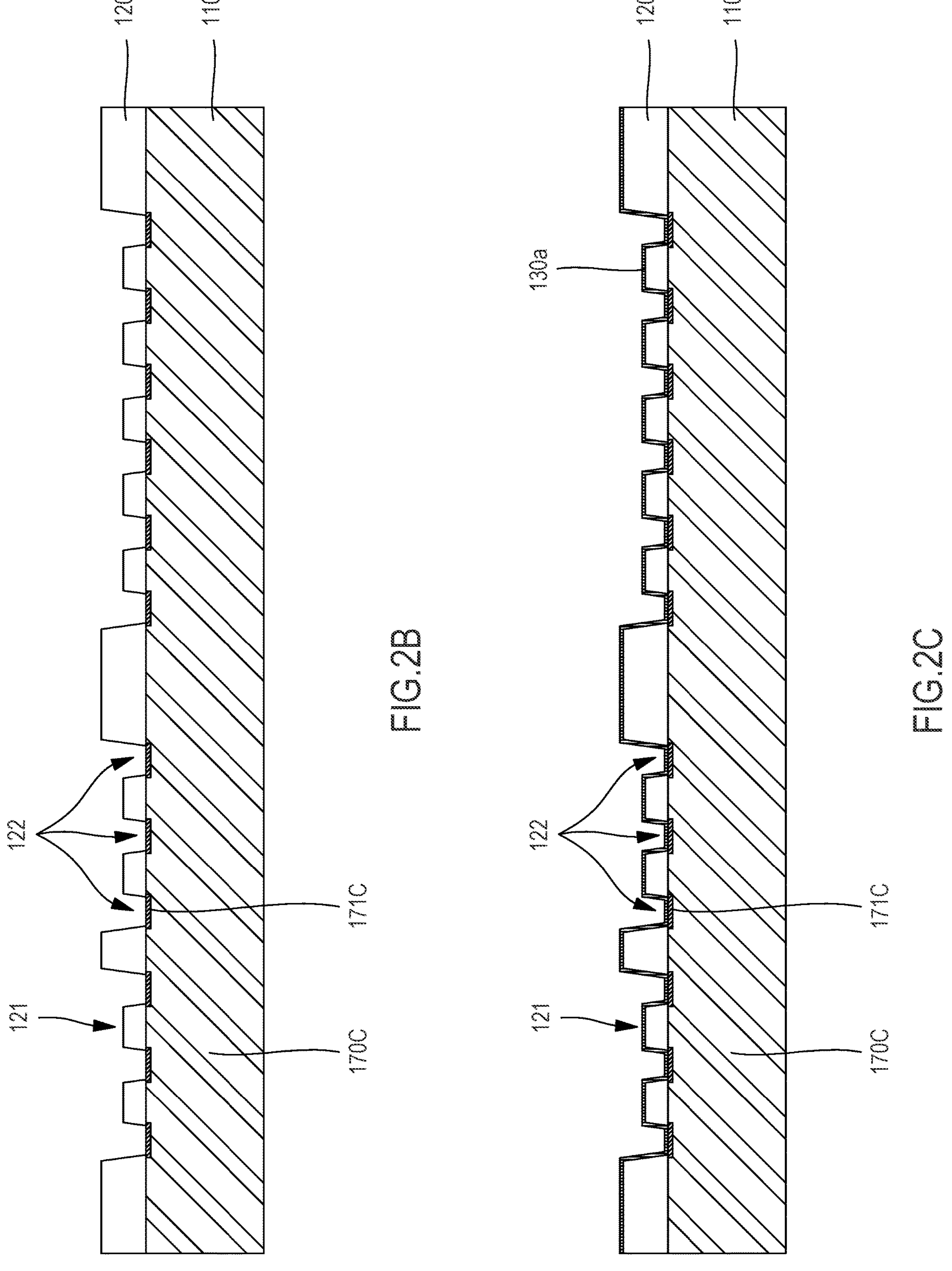
Figures 2D, 2E:
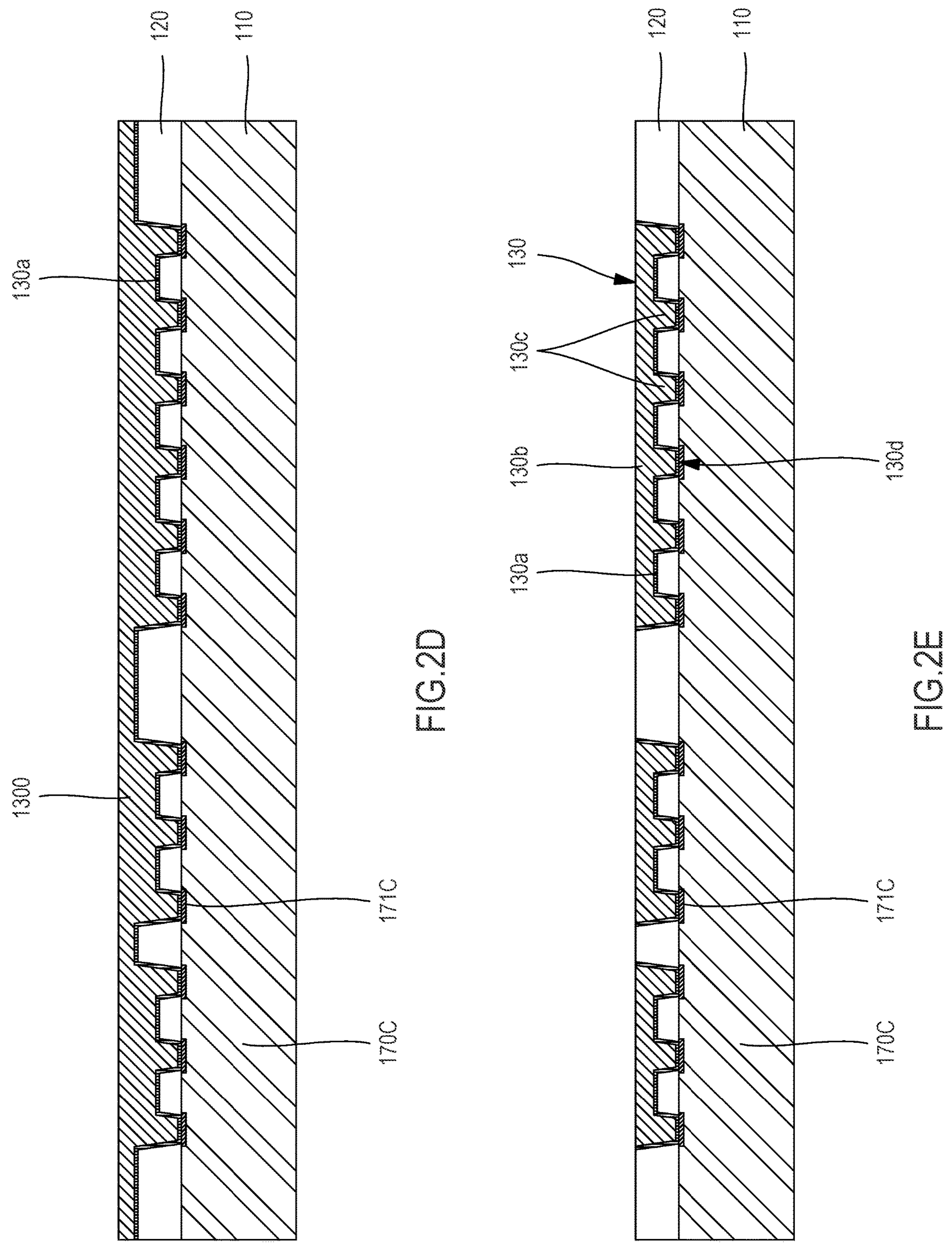
Figures 2F, 2G:
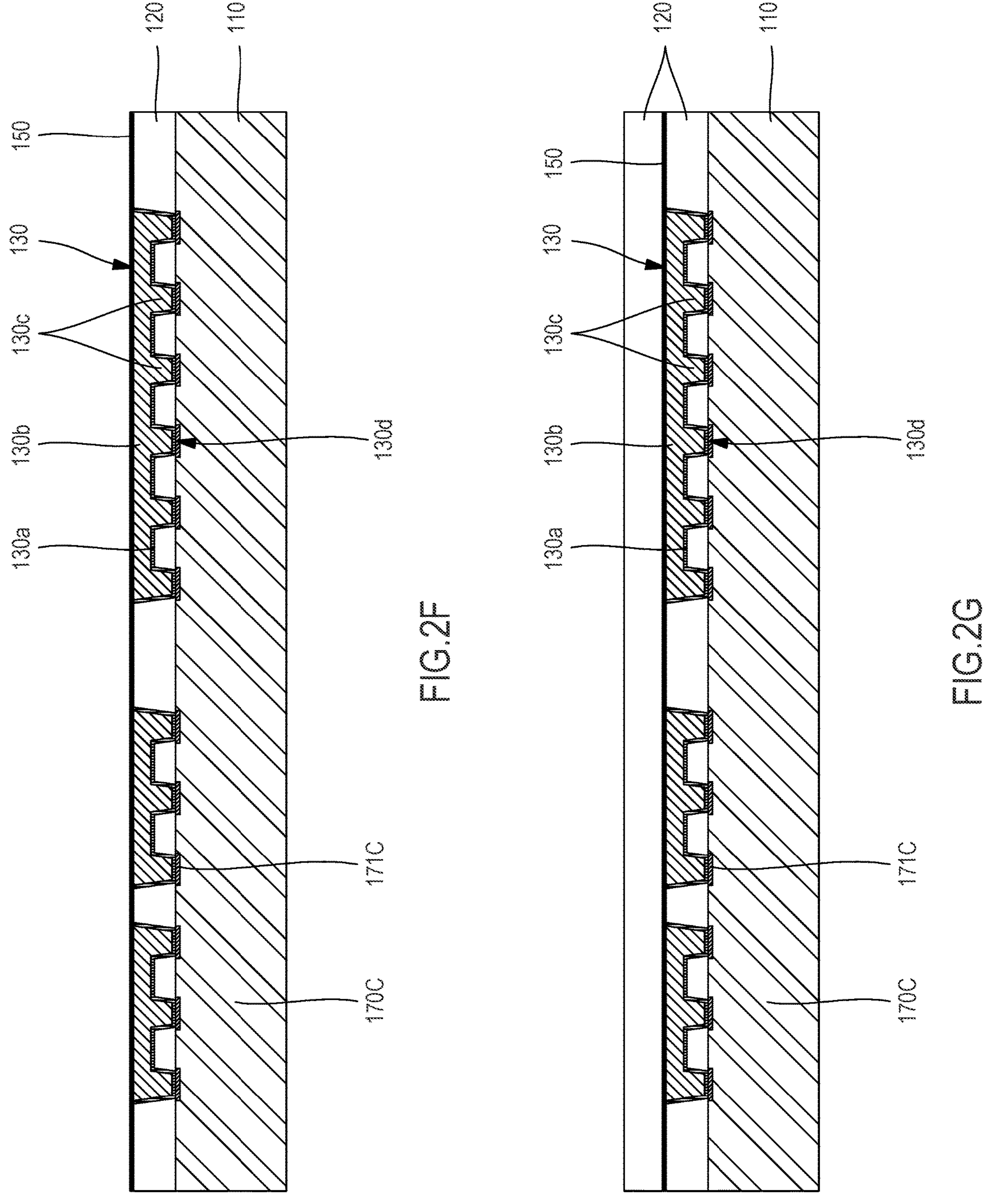
Figures 2H, 2I:
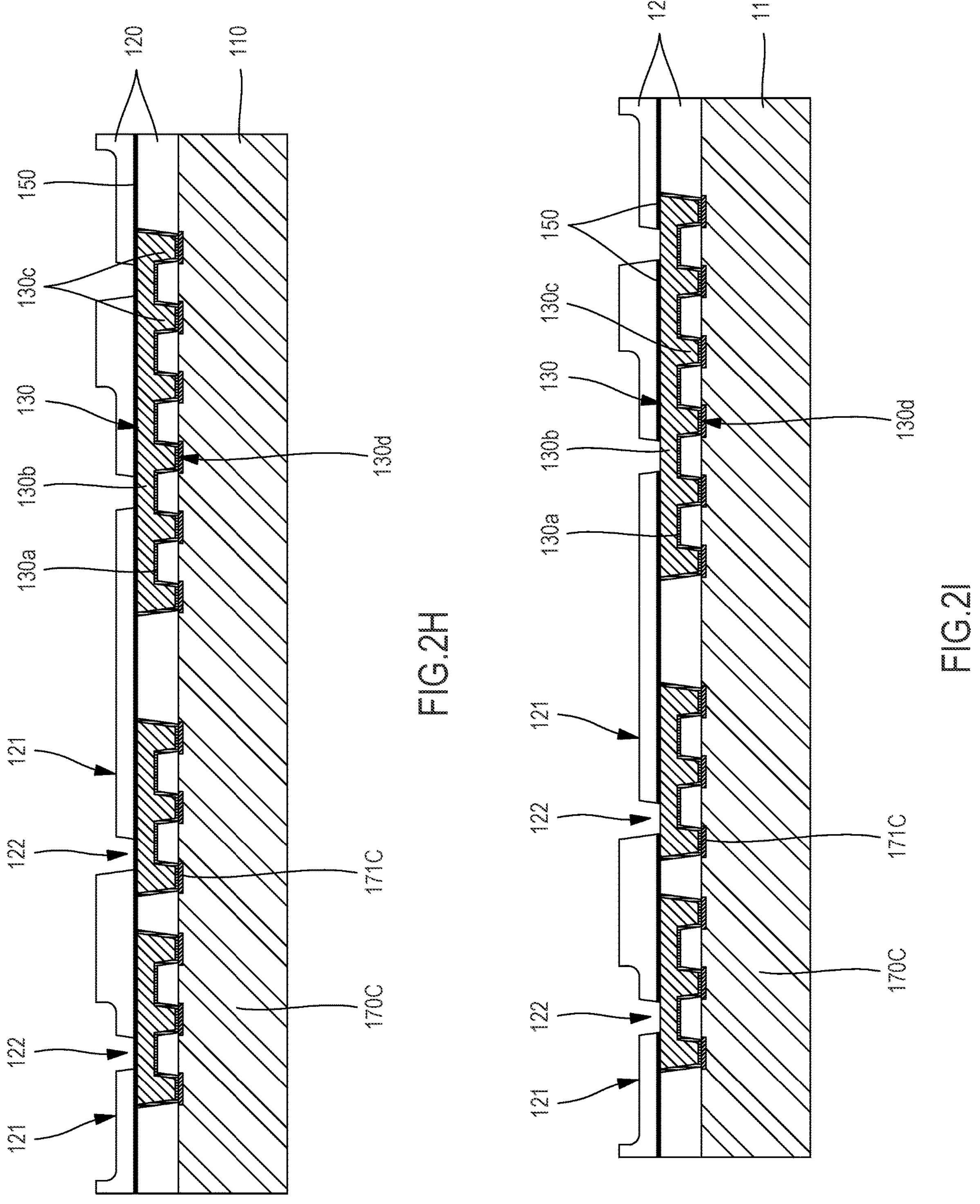
Figures 2J, 2K:
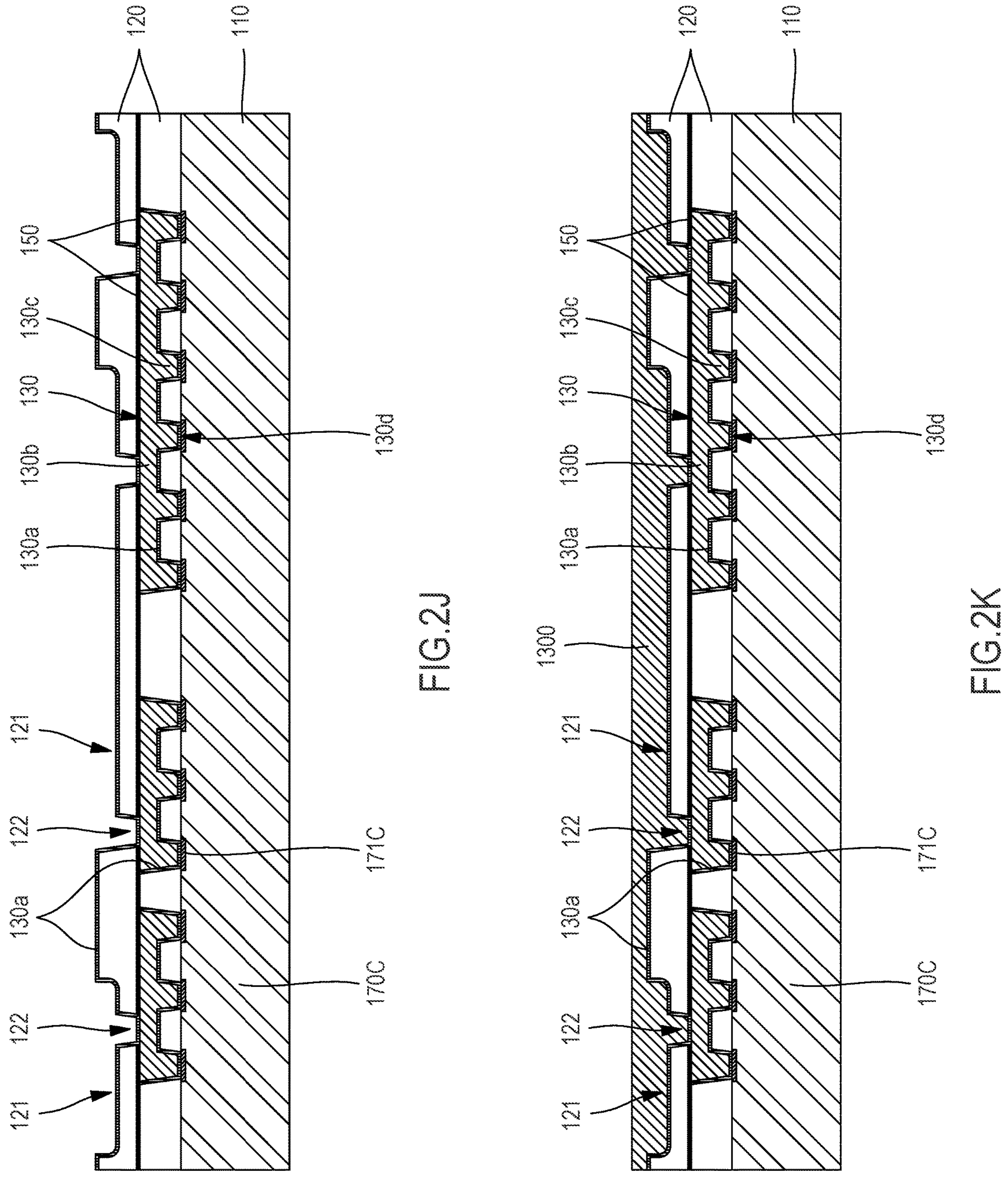
Figures 2L, 2M:
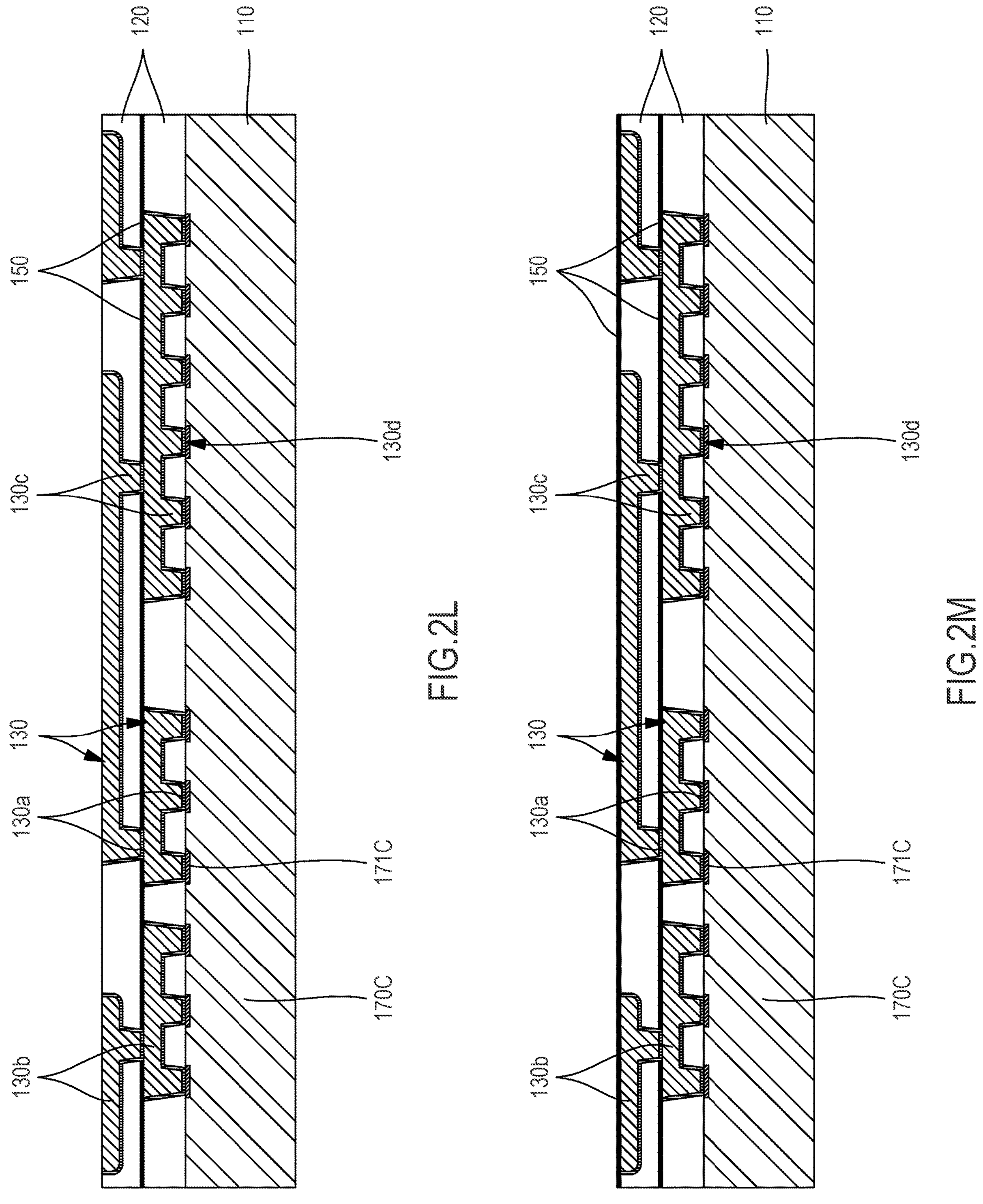
Figures 2N, 2O:
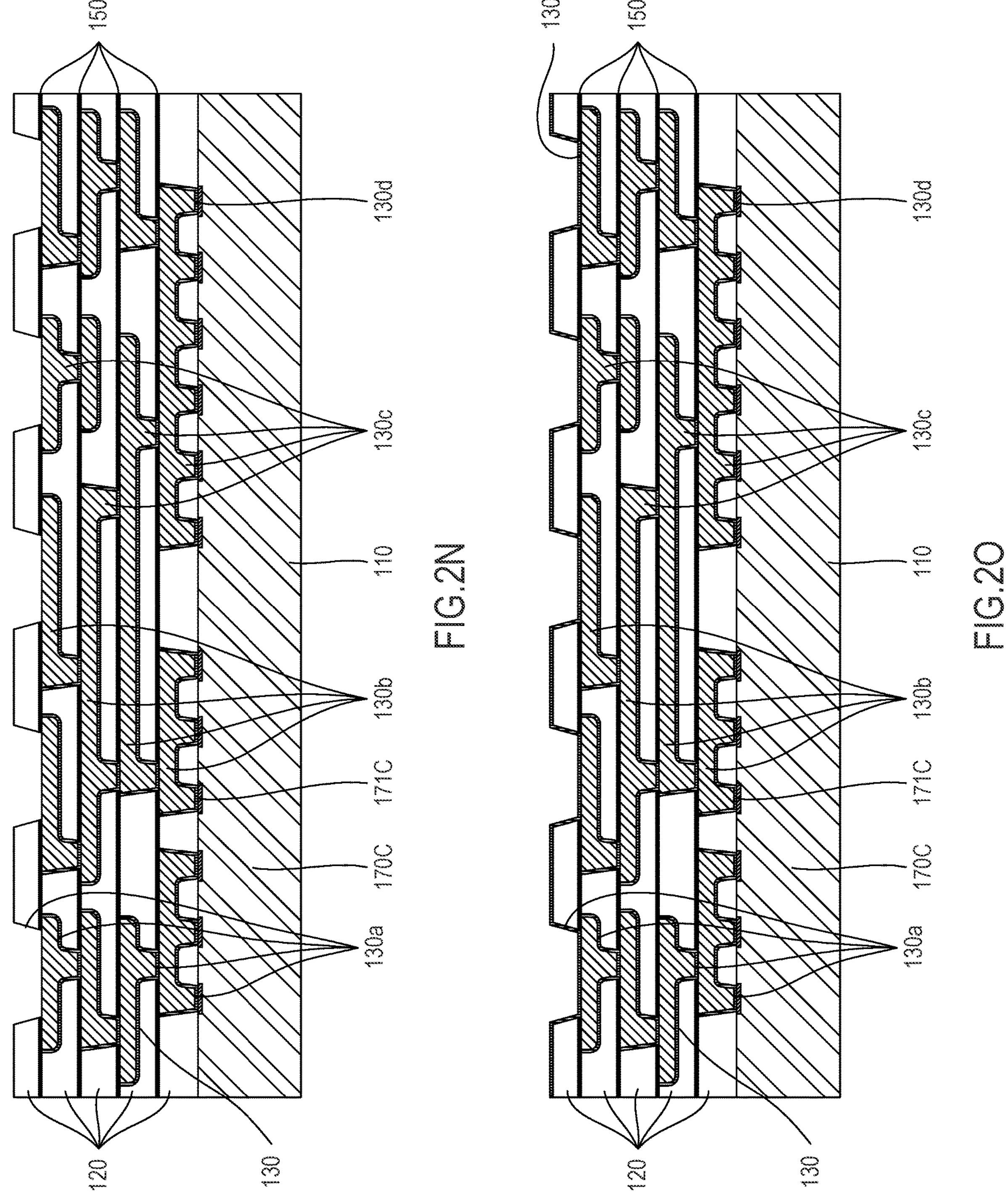
Figures 2P, 2Q:
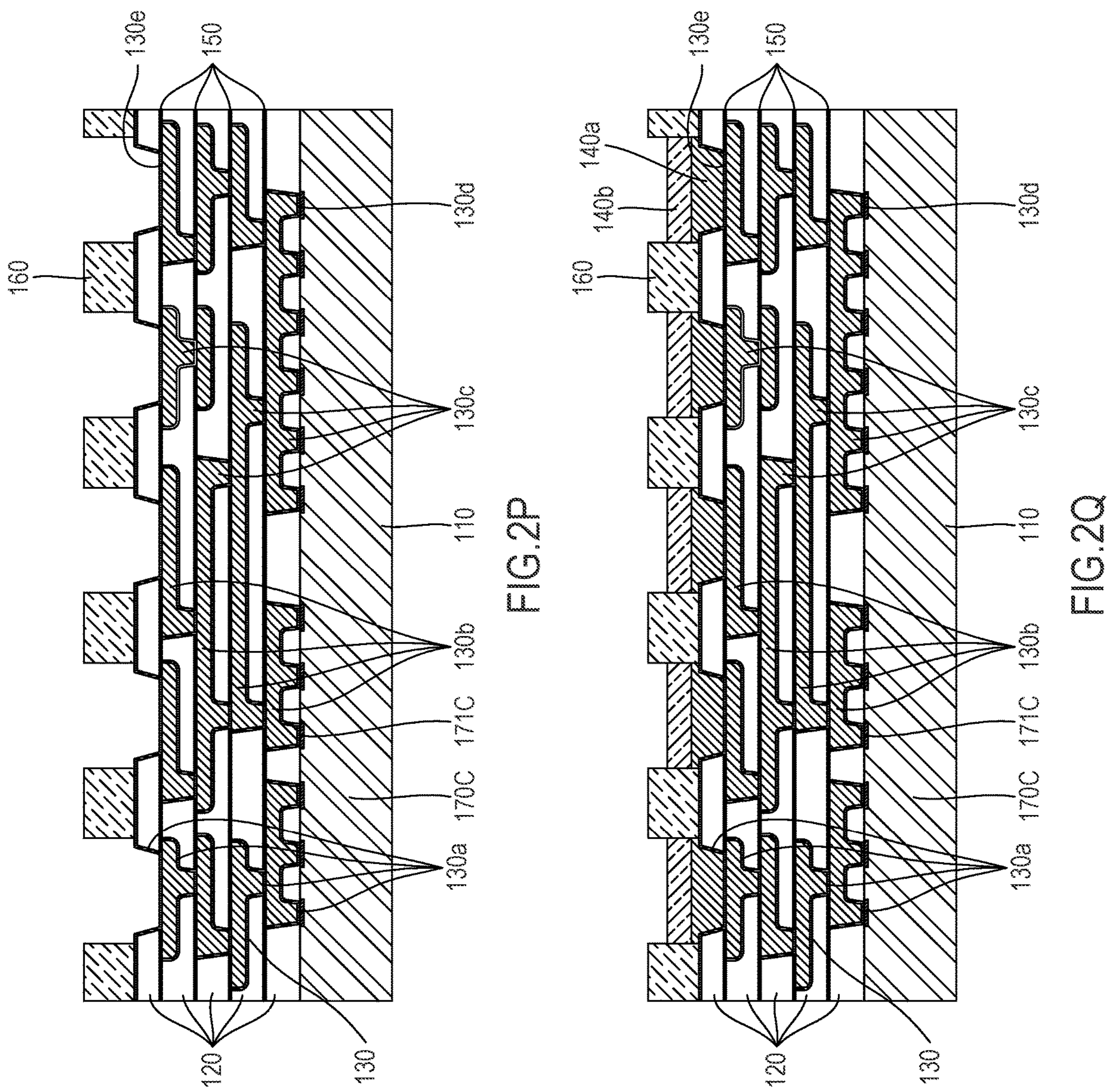
Figures 2R, 2S:
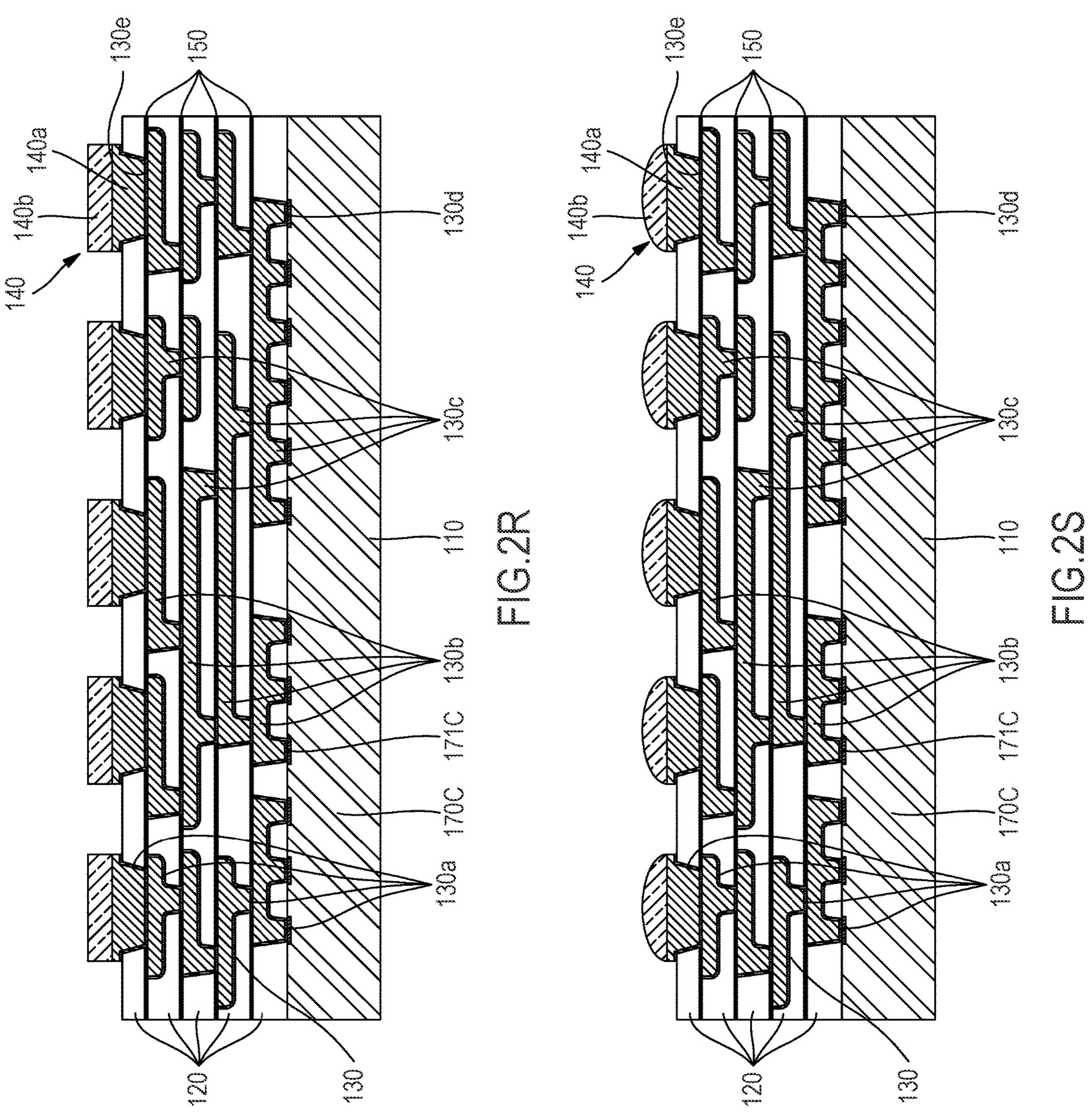

FIGS. 2A to 2S show cross-sectional views of an example method for manufacturing electronic component 100. FIG. 2A shows a cross-sectional view of electronic component 100 at an early stage of manufacture.

In the example shown in FIG. 2A, dielectric 120 can be provided on substrate 110. In some examples, substrate 110 can comprise or be referred to as a wafer, a reconstituted wafer, or a removable carrier.

In some examples, the wafer can be used when manufacturing a Wafer Level Package (WLP) or a Wafer Level Chip Size Package (WLCSP) package, the reconstituted wafer can be used when manufacturing a Wafer Level Fan Out (WLFO) package, and the removable carrier can be used when manufacturing High Density Fan Out (HDFO) or Silicon Wafer Fan-Out Technology (SWIFT®) or Redistribution Layer (RDL) interposer or Substrate SWIFT® (S-SWIFT®) packages.

In some examples, the wafer can comprise a plurality of semiconductor dies, which can comprise good or bad dies. In some examples, the reconstituted wafer can be a configuration in which good semiconductor dies are aggregated. In some examples, the removable carrier can comprise or be referred to as glass, ceramic, or metal. Substrate 110 can be optional or application dependent. The thickness of substrate 110 can range from about 20 micrometers (μm) to about 1000 μm. Substrate 110 can support dielectric 120, conductive tier 130, outer interconnect 140, and barrier 150 until or after completion of the fabrication process.

Dielectric 120 can be configured by providing a dielectric material on substrate 110. In some examples, dielectric 120 can comprise an organic material. In some examples, the dielectric material can comprise or be referred to as a photo imageable organic passivation material, polyimide (PI), benzocyclobutene (BCB), polybenzoxazole (PBO), phenolic resin, or Ajinomoto Buildup Film (ABF). Such dielectric material can be coated or spun-on in liquid form or attached as a pre-formed film on substrate 110. The thickness of dielectric structure 120 can range from about 3 μm to about 100 μm. Dielectric 120 can support conductive tier 130 to be provided in a later process.

FIG. 2B shows a cross-sectional view of electronic component 100 at a later stage of manufacture. In the example shown in FIG. 2B, dielectric 120 can be patterned. In some examples, path pattern 121 and via pattern 122 can be provided on dielectric 120 by a patterning process. The patterning process can comprise coating, photo exposure, develop, and cure process.

In some examples, a photoresist layer can be provided on dielectric 120, for example by spin coating, spray coating, dip coating, or rod coating. In some examples, the photoresist layer can be provided by laminating a dry film. In some examples, a mask with a pattern can be positioned on the photoresist layer and ultraviolet (UV) rays can be exposed to the mask to transfer the pattern to the photoresist layer. A transferred portion or a non-transferred portion of the photoresist layer can be developed and cured, and the photoresist layer can comprise the patten. A portion of dielectric 120 can be exposed through the pattern. A first portion of dielectric 120 can be etched using the photoresist pattern as a mask. In some examples, the etching of dielectric 120 can be processed by a wet etching such as immersion or spray, or a dry etching such as plasma etch, Reactive Ion Etching (RIE), or sputter etch. In some examples, such first etching can etch only partially through dielectric 120 to define a base for path patterns 121. The patterning process can be repeated, such that a second portion of dielectric 120 can be etched using a second photoresist pattern as a mask to define via patterns 122 through dielectric 120. Due to the dual patterning process, the depth of via pattern 122 can be greater than that of path pattern 121, and a portion of substrate 110 can be exposed through via pattern 122. In some examples, vertices similar to arcuate vertices 130*x* or 130*y* of FIG. 1 can result from such respective sequential etching processes. In some examples, the portion of substrate 110 corresponding to via pattern 122 can comprise an input/output terminal. The input/output terminal can comprise or be referred to as pad, land, Under Bump Metal (UBM), or stud.

FIG. 2C shows a cross-sectional view of electronic component 100 at a later stage of manufacture. In the example shown in FIG. 2C, seed 130*a* can be provided on dielectric 120. Seed 130*a* can be provided on path pattern 121 and via pattern 122. Seed 130*a* can also be provided on the portion of substrate 110 exposed through via pattern 122. In some examples, seed 130*a* on dielectric 120 and substrate 110 can be electrically shorted. In some examples, seed 130*a* can comprise or can be referred to as a barrier structure. In some examples, seed 130*a* or trench barrier 130*a* can comprise titanium/copper (Ti/Cu), thallium/copper (Ta/Cu), titanium tungsten/copper (TiW/Cu), or titanium/titanium-nitride/copper (Ti/TiN/Cu). In some examples, seed 130*a* or trench barrier 130*a* can comprise a barrier metal such as titanium (Ti), tantalum (Ta), titanium-tungsten (TiW), or titanium-nitride (TiN) provided on dielectric 120 since copper (Cu) tends to diffuse into dielectric 120. Then, Cu can be provided on the barrier metal. The barrier metal including Ti, Ta, TiW, or TiN can be provided through atomic layer deposition (ALD), physical vapor deposition (PVD), chemical vapor deposition (CVD), low pressure chemical vapor deposition (LPCVD), or plasma enhanced chemical vapor deposition (PECVD). Seed 130*a* including Cu can be provided through PVD, ALD, CVD, LPCVD, or PECVD. The thickness of seed 130*a* can range from about 0.05 μm to about 1 μm. Seed 130*a* can provide a current supply path when conductive tier 130 is electroplated later.

FIG. 2D shows a cross-sectional view of electronic component 100 at a later stage of manufacture. In the example shown in FIG. 2D, conductive structure 1300 can be provided on seed 130*a*. In some examples, conductive structure 1300 can be provided over substrate 110 and dielectric 120, including path patterns 121 and via patterns 122. In some examples, conductive structure 1300 can comprise or be referred to as an electrodeposition layer or an electrode plating layer. In some examples, conductive structure 1300 can comprise copper (Cu), nickel (Ni), palladium (Pd), silver (Ag), or gold (Au). In some examples, conductive structure 1300 can be provided by electrodeposition on seed 130*a*. In some examples, electrodeposition can be a method to produce in situ metallic coatings by the action of an electric current on a conductive material immersed in a solution containing a salt of the metal to be deposited. The thickness of conductive structure 1300 can be provided thicker than the thickness of RDL patterns and via patterns to be provided later. The thickness of conductive structure 1300 can range from about 3 μm to about 200 μm. Conductive structure 1300 can provide conductive tiers 130 separated from each other after a later process.

FIG. 2E shows a cross-sectional view of electronic component 100 at a later stage of manufacture. In the example shown in FIG. 2E, a top side of conductive structure 1300 can be planarized. In some examples, a chemical mechanical polishing pad can grind the top side of conductive structure 1300. Chemical mechanical polishing can be performed until the top side of dielectric 120 is exposed. In some examples, a portion of seed 130*a* on the top side of dielectric 120 can also be grinded or removed. In some examples, after the chemical mechanical polishing process, the top side of conductive structure 1300 and top side of dielectric 120 can be coplanar. In some examples, conductive tiers 130 can be electrically and mechanically isolated from each other. Conductive tier 130 with conductive paths 130*b* and conductive vias 130*c* can be provided on dielectric 120. In some examples, conductive vias 130*c* corresponding to the input/output terminal of substrate 110 can be defined as inward terminal 130*d*. In some examples, conductive tiers 130 can comprise or be referred to as traces, vias, pads, or conductive paths. The thickness of conductive tier 130 can range from about 3 μm to about 100 μm. The conductive tier 130 can provide a horizontal or vertical current path between electronic component 100 and an external device. In some examples, dielectric 120 comprises a single a layer of dielectric material wherein conductive tier 130 is in the single layer of dielectric material. In some examples, conductive tier 130 comprises conductive path 130*b* coupled with conductive via 130*c* such that conductive path 130*b* and conductive via 130*c* are in the single layer of dielectric material. In some examples, conductive tier 120 extends from one side of dielectric 120 to another side of dielectric 120. In other examples, conductive tier 120 only partially extends from one side of dielectric 120 without reaching the other side of dielectric 120.

FIG. 2F shows a cross-sectional view of electronic component 100 at a later stage of manufacture. In the example shown in FIG. 2F, barrier 150 or barrier layer 150 can be provided on dielectric 120 and conductive tier 130. In some examples, barrier 150 can contact seed 130*a*. Accordingly, conductive tier 130 can be covered by barrier 150 as well as seed 130*a*. The top side of conductive tier 130 can be wrapped with barrier 150, and bottom sides and lateral sides of conductive tier 130 can be wrapped with seed 130*a*. In some examples, barrier 150 or barrier structure 150' can comprise an inorganic material. In some examples, barrier 150 or barrier structure 150' can comprise or be referred to as a non-conductive or dielectric inorganic material, or inorganic passivation deposition layer. In some examples, barrier layer 150 can comprise $SiO_2$ or $Si_3N_4$. In some examples, barrier 150 can be deposited by supplying silicon (Si) and oxygen (O) or nitrogen (N) over dielectric 120 and conductive tier 130 at a high temperature, for example about 300° C. to about 500° C. The thickness of barrier 150 can range from about 0.01 μm to about 10 μm. Barrier 150 can mitigate or prevent copper ions of conductive tier 130 from migrating to dielectric 120.

FIG. 2G shows a cross-sectional view of electronic component 100 at a later stage of manufacture. In the example shown in FIG. 2G, another dielectric 120 can be provided on barrier 150. The process shown in FIG. 2G can be substantially similar to the process shown in FIG. 2A. Dielectric 120 can be configured by providing a dielectric material on barrier 150. In some examples, the dielectric material can comprise or be referred to as a photo imageable organic passivation material, PI, BCB, PBO, phenolic resin, or ABF. Such dielectric material can be coated or spun-on in liquid form or attached as a pre-formed film on barrier 150. Dielectric 120 can support conductive tier 130 to be provided in a later process.

FIG. 2H shows a cross-sectional view of electronic component 100 at a later stage of manufacture. In the example shown in FIG. 2H, dielectric 120 can be patterned. In some examples, path pattern 121 and via pattern 122 can be provided on dielectric 120 by a patterning process. The process shown in FIG. 2H can be substantially similar to the process shown in FIG. 2B. Through the patterning process, a portion of barrier 150 can be exposed through via pattern 122.

FIG. 2I shows a cross-sectional view of electronic component 100 at a later stage of manufacture. In the example shown in FIG. 2I, a portion of barrier 150 can be removed. In some examples, dielectric 120 on barrier 150 can be used as a mask and the portion of barrier 150 can be etched. In some examples, the portion of barrier 150 can be removed using a wet etching process or a dry etching process. In some examples, the portion of barrier 150 can be etched and removed using nitric acid ($HNO_3$), hydrofluoric acid (HF), or phosphoric acid ($H_3PO_3$). A portion of conductive tier 130 can be exposed through barrier 150 by the process of etching or removing the portion of barrier 150.

FIG. 2J shows a cross-sectional view of electronic component 100 at a later stage of manufacture. In the example shown in FIG. 2J, seed 130*a* can be provided on dielectric 120 and conductive tier 130. In some examples, seed 130*a* can cover an exposed portion of conductive tier 130. In some examples, seed 130*a* can be coupled to barrier 150. In some examples, a portion of the top side of conductive tier 130 can be covered with barrier 150 and another portion of the top side of conductive structure 130 can be covered with seed 130*a*. The process shown in FIG. 2J can be substantially similar to the process shown in FIG. 2C.

FIG. 2K shows a cross-sectional view of electronic component 100 at a later stage of manufacture. In the example shown in FIG. 2K, conductive structure 1300 can be provided on seed 130*a*. In some examples, the conductive structure 1300 can be provided over dielectric 120, including path patterns 121 and via patterns 122. In some examples, conductive structure 1300 can comprise or be referred to as an electrodeposition layer or an electrode plating layer. In some examples, conductive structure 1300 can comprise copper (Cu), nickel (Ni), palladium (Pd), silver (Ag), or gold (Au). The process shown in FIG. 2K can be substantially similar to the process shown in FIG. 2D.

FIG. 2L shows a cross-sectional view of electronic component 100 at a later stage of manufacture. In the example shown in FIG. 2L, a top side of conductive structure 1300 can be planarized. In some examples, a chemical mechanical polishing pad can grind the top side of conductive structure 1300. Chemical mechanical polishing can be performed until the top side of dielectric 120 is exposed. In some examples, a portion of seed 130*a* on the top side of dielectric 120 can also be ground and removed. In some examples, after the chemical mechanical polishing process, the top side of conductive tier 130 and top side of dielectric 120 can be coplanar. In some examples, conductive tiers 130 can be electrically and mechanically isolated from each other. Conductive tier 130 with conductive paths 130*b* and conductive vias 130*c* can be provided on dielectric 120. The process shown in FIG. 2L can be substantially similar to the process shown in FIG. 2E. In some examples, one conductive tier 130 of one dielectric 120 can be coupled with another conductive tier 130 of another dielectric 120 through an opening in barrier 150 or barrier structure 150'. In some examples, barrier 150 or barrier structure 150' can fully cover dielectric 120 and can partially cover conductive tier 130 to accommodate the opening.

FIG. 2M shows a cross-sectional view of electronic component 100 at a later stage of manufacture. In the example shown in FIG. 2M, barrier 150 can be provided on dielectric 120 and conductive tier 130. In some examples, barrier 150 can contact seed 130*a*. Accordingly, conductive tier 130 can be covered by barrier 150 as well as seed 130*a*. The top side of conductive tier 130 can be wrapped with barrier 150, and bottom sides and lateral sides of conductive tier 130 can be wrapped with seed 130*a*. Copper ions of conductive tier 130 are mitigated or prevented from migrating into dielectric 120. The process shown in FIG. 2M can be substantially similar to the process shown in FIG. 2F.

FIG. 2N and FIG. 2O show cross-sectional views of electronic component 100 at a later stage of manufacture. In the examples shown in FIG. 2N and FIG. 2O, a process similar to the fabrication process shown in FIGS. 2A-2M can be repeated multiple times. Accordingly, dielectric 120 or conductive tier 130 can comprise at least one or more layers. In some examples, conductive layers can be interleaved between dielectric layers. In some examples, dielectric layers can be interleaved between conductive layers. In some examples, the bottom sides and the lateral sides of conductive tier 130 can be generally wrapped with seed 130*a*, and the top side of conductive tier 130 can be generally wrapped with barrier 150. In some examples, conductive paths 130*b* disposed on different layers can be electrically coupled to each other through conductive vias 130*c*. In some examples, a portion of the top side of conductive paths 130*b* corresponding to conductive vias 130*c* can be covered with seed 130*a*. In some examples, seed 130*a* and barrier 150 of the same layer can be coplanar.

FIG. 2P shows cross-sectional view of electronic component 100 at a later stage of manufacture. In the examples shown in FIG. 2P, a photoresist can be coated on the top side dielectric 120, and then photoresist pattern 160 can be provided through an exposure and development process. Accordingly, a portion of seed 130*a*, for example a portion corresponding to conductive paths 130*b*, can be exposed through photoresist pattern 160.

FIG. 2Q shows cross-sectional view of electronic component 100 at a later stage of manufacture. In the examples shown in FIG. 2Q, outer interconnect 140 can be provided on conductive tier 130, for example topmost conductive paths 130*b*. In some examples, outer interconnect 140 can comprise contact pad 140*a* and terminal tip 140*b*. Contact pad 140*a* can be provided on seed 130*a*. In some examples, contact pad 140*a* can be provided on a portion defined by photoresist pattern 160. Accordingly, the plurality of contact pads 140*a* can be independently provided while being separated from each other. The fabrication process of contact pad 140*a* shown in FIG. 2Q can be similar to the process shown in FIGS. 2D and 2K, except the plurality of contact pads 140*a* are provided independently. In some examples, the thickness of contact pad 140*a* can range from about 3 μm to about 500 μm. In some examples, terminal tip 140*b* can be electrolytically deposited on contact pad 140*a*. Terminal tip 140*b* can also be provided on the portion defined by photoresist pattern 160. In some examples, terminal tip 140*b* can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, the thickness or width of terminal tip 140*b* can range from about 0.01 millimeter (mm) to about 10 mm. Terminal tip 140*b* can serve to mechanically or electrically couple electronic component 100 to an external device.

FIG. 2R shows cross-sectional view of electronic component 100 at a later stage of manufacture. In the examples shown in FIG. 2R, photoresist pattern 160 can be removed by a liquid resist stripper. In some examples, the liquid resist stripper can comprise monoethanolamine and 2-butoxy ethanol. In some examples, photoresist pattern 160 can be removed by an oxygen-containing plasma. In some examples, photoresist pattern 160 can also be removed by a 1-methyl-2-pyrrolidone (NMP) solvent. In some examples, once photoresist pattern 160 is dissolved, the solvent can be removed by heating to about 80° C., so no residue is left. As described above, the top side and lateral sides of outer interconnect 140 comprising contact pad 140*a* and terminal tip 140*b* can be exposed.

Outer interconnect 140 can be used as a mask, and a portion of seed 130*a* around outer interconnect 140 can be removed. The thickness of seed 130*a* can be much smaller than the thickness of outer interconnect 140, so outer interconnect 140 can be used as a mask. In some examples, the portion of seed 130*a* can be removed by a wet or dry etching process. In some examples, Cu of seed 130*a* can be first etched, and then Ti or TiW of seed 130*a* can be etched. In some examples, the portion of seed 130*a* can be etched and removed using etchant containing hydrogen peroxide ($H_2O_2$) in any one of carboxylic acid, carboxylate, or an acetyl group ($CH_3CO$—). Accordingly, the top side of dielectric 120, which is the surrounding of the outer interconnect 140, can be exposed, and an end of seed 130*a* can be also exposed.

FIG. 2S shows cross-sectional view of electronic component 100 at a later stage of manufacture. In the examples shown in FIG. 2S, terminal tip 140*b* of outer interconnect 140 can be generally spherical by a reflow process or laser assisted process. In some examples, these processes can be provided by about 150° C. to about 250° C., so terminal tip 140*b* can be reflowed.

In some examples, a redistribution layer ("RDL") substrate can be provided on substrate 110. RDL substrate can comprise one or more conductive redistribution layers and one or more dielectric layers that (a) can be formed layer by layer over an electronic device to which the RDL substrate is to be coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), polybenzoxazole (PBO), resin, or Ajinomoto build-up film (ABF). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of one or more inorganic dielectric layers can comprise silicon nitride ($Si_3N_4$), silicon oxide ($SiO_2$), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4, and these types of RDL substrates can be referred to as a coreless substrate.

In a subsequent process, electronic component 100 can be provided by a singulation or a sawing process. In some examples, substrate 110, dielectric structure 120' or conductive structure 130' can be sawed by diamond blade wheels or laser beams, so electronic component 100 can be provided. Accordingly, lateral sides of substrate 110, dielectric structure 120' or conductive structure 130' can be coplanar with each other.

In a subsequent process, if substrate 110 is a removable carrier, substrate 110 can be separated from dielectric structure 120' or conductive structure 130'. In some examples, a wafer support system can be attached on redistribution structure comprising dielectric structure 120' and conductive structure 130', and substrate 110 can then be removed. In some examples, when a temporary adhesive film is interposed between redistribution structure and substrate 110, heat or light such as a laser beam can be provided to the temporary adhesive film to reduce the adhesive strength of the temporary adhesive film, and thus, substrate 110 can be removed from the redistribution structure. In some examples, substrate 110 can be forcibly peeled from the redistribution structure by mechanical force. In some examples, substrate 110 can be removed by mechanical grinding and chemical etching. In some examples, the wafer support system can fix redistribution structure and the grinder rubs and rotates against substrate 110, thereby removing substrate 110. In some examples, the wafer support system and the grinder can rotate in opposite directions, and thus substrate 110 can be removed.

By removing or separating substrate 110, the bottom side of the redistribution structure can be exposed. In some examples, inward terminal 130*d* of the redistribution structure can be exposed from dielectric structure 120'. In some examples, the bottom side, for example seed 130*a*, of inward terminal 130*d* and the bottom side of dielectric structure 120' can be coplanar.

Figures 3, 4:
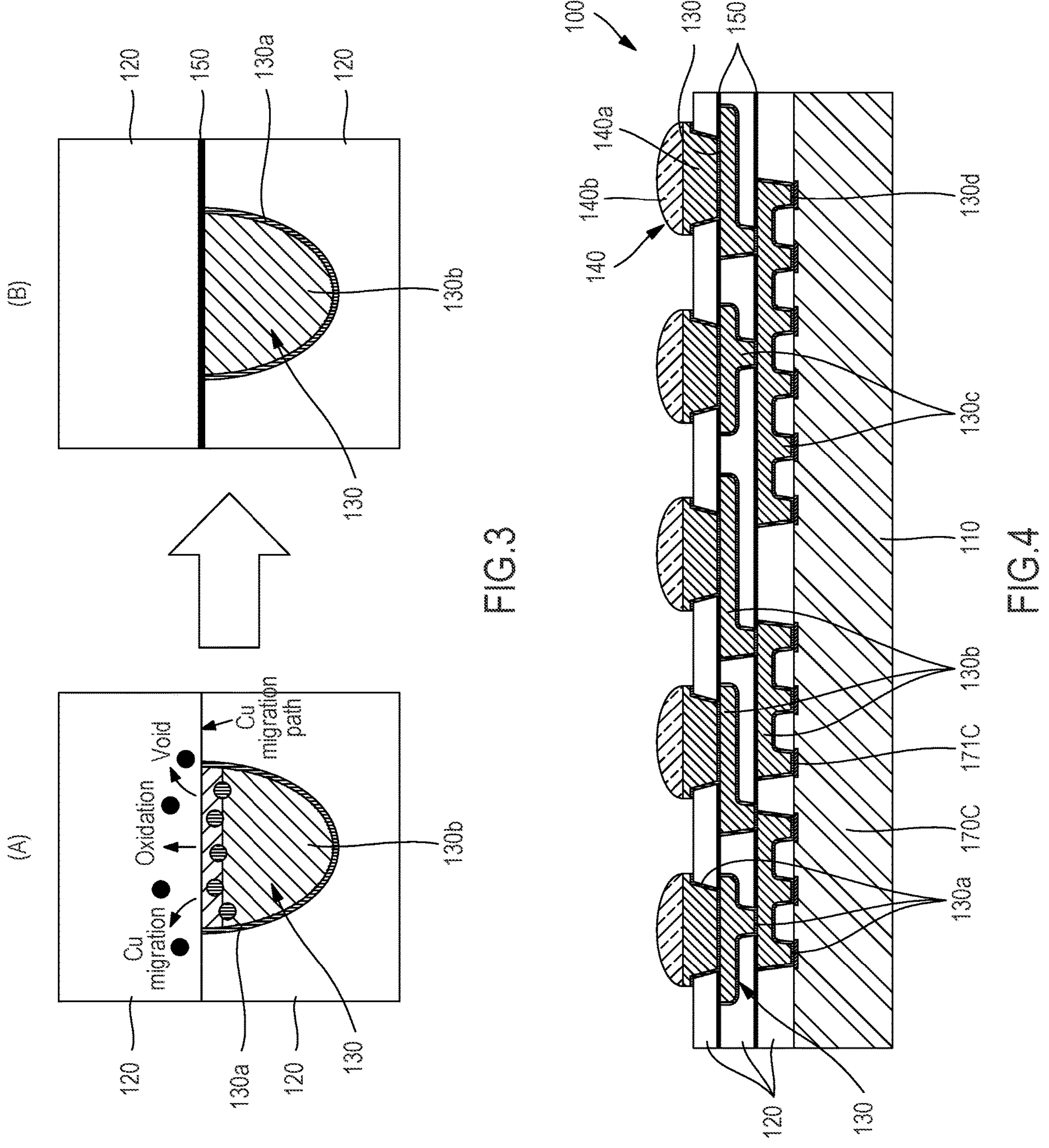
FIG. 3 shows a cross-sectional view of an example electronic component.
FIG. 4 shows a cross-sectional view of an example electronic device.

FIG. 3 shows a cross-sectional view of an example electronic component 100. In both illustration (A) and illustration (B) of FIG. 3, the bottom and lateral sides of conductive tier 130 made of Cu are buried in bottom dielectric 120 while being surrounded by seed 130*a* or trench barrier 130*a* made of Ti. Illustrate (A) of FIG. 3 shows a case in which barrier 150 is not present on the top side of conductive structure 130, for example at the boundary between the top and bottom dielectrics 120. Illustration (B) of FIG. 3 shows a case in which barrier 150 is present on the top side of conductive tier 130, for example at the boundary between the top and bottom dielectrics 120. Dielectric 120 on a top side or an upper side can be over dielectric 120 on a bottom side or a lower side.

As shown in illustration (A) of FIG. 3, copper ions can migrate from conductive tier 130 to the top dielectric 120, or oxidation or voids can be generated in the top dielectric 120. The boundary between the top and bottom dielectrics 120 can serve as a copper ion migration path. As shown in illustration (B) of FIG. 3, when the top side of conductive tier 130 is covered with barrier 150, migration of copper ions can be restricted, or generation of oxidation or voids can be restricted, in dielectric 120. Barrier 150 or barrier structure 150' can mitigate migration of copper ions or can prevent migration of copper ions altogether from conductive tier 130 into the upper dielectric 120.

FIG. 4 shows a cross-sectional view of an example electronic device 100A. In the example shown in FIG. 4, electronic device 100A can comprise substrate 110, dielectrics 120, conductive tiers 130, outer interconnects 140, and barrier 150. In some examples, electronic device 100A can be manufactured in a process similar to the process shown in FIGS. 2A to 2S described above. In some examples, electronic device 100A can comprise or be referred to as WLP or WLCSP. In some examples, conductive via 130*c* of conductive tier 130 can extend toward substrate 110 and can be coupled with substrate 110.

In some examples, substrate 110 can comprise or be referred to as a semiconductor die, a semiconductor chip, or a semiconductor package. In some examples, the die or chip can comprise an integrated circuit die separated from a semiconductor wafer. In some examples, substrate 110 can comprise a digital signal processor (DSP), a network processor, a power management unit, an audio processor, a radio-frequency (RF) circuit, a wireless baseband system-on-chip (SoC) processor, a sensor, or an application specific integrated circuit (ASIC). Substrate 110 can perform calculation and control processing, store data, or remove noise from electrical signals.

Figures 5, 6:
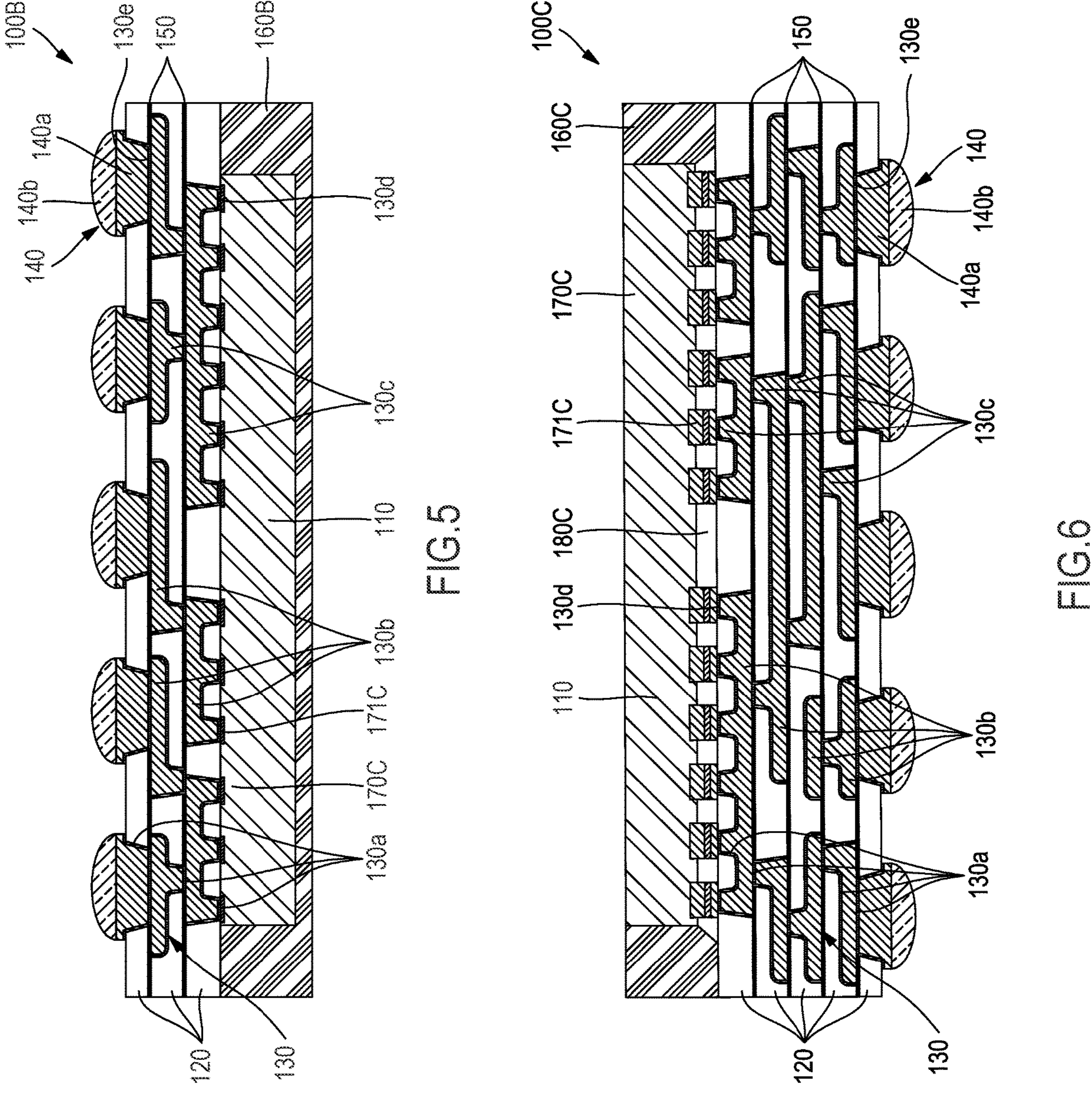
FIG. 5 shows a cross-sectional view of an example electronic device.
FIG. 6 shows a cross-sectional view of an example electronic device.

FIG. 5 shows a cross-sectional view of an example electronic device 100B. In the example shown in FIG. 5, electronic device 100B can comprise substrate 110, dielectrics 120, conductive tiers 130, outer interconnect 140, barrier 150, and encapsulant 160B. Electronic device 100B shown in FIG. 5 can be similar to electronic device 100A shown in FIG. 4 except electronic device 100B comprise encapsulant 160B. In some examples, electronic device 100B can be fabricated by a process similar to the process shown in FIGS. 2A to 2S described above after substrate 110 is encapsulated with encapsulant 160B. In some examples, encapsulant 16B can be coupled with a lateral side of substrate 110 and can be coupled with dielectric 120.

In some examples, encapsulant 160B can comprise an epoxy resin or a phenol resin, carbon black, or a silica filler. In some examples, encapsulant 160B can comprise or be referred to as a mold compound, a resin, a sealant, a filler-reinforced polymer, or an organic body. In some examples, encapsulant 160B can contact or cover a bottom side or lateral sides of substrate 110. In some examples, a bottom side of encapsulant 160B can be lower than the bottom side of substrate 110. In some examples, the bottom side of encapsulant 160B and the bottom side of substrate 110 can be coplanar and the bottom side of substrate 110 can be exposed from the bottom side of encapsulant 160B.

In some examples, encapsulant 160B can be provided by transfer molding, compression molding, liquid encapsulant molding, vacuum lamination, paste printing, or film assist molding. Transfer molding can be a process of curing by supplying a fluid resin from a gate or supply port of a mold to the periphery of corresponding substrate 110. Compression molding can be a process of supplying a fluid resin into a mold in advance and then putting substrate 110 into the mold to cure the fluid resin. The thickness of encapsulant 160B can range from about 100 μm to about 2000 μm. Encapsulant 160B can protect substrate 110 from external environment or environmental exposure and can quickly dissipate heat from substrate 110.

In some examples, an RDL substrate can be provided on the top side of encapsulant 160B as well as on the top side of substrate 110. In some examples, the RDL substrate comprises dielectric structure 120' and conductive structure 130'. In some examples, the process shown in FIGS. 2A-2S described above can be implemented on the top side of substrate 110 and the top side of encapsulant 160B. In some examples, the top side of substrate 110 and the top side of encapsulant 160B can be coplanar. In some examples, dielectric structure 120 and conductive structure 130 can be provided on the top side of substrate 110 and the top side of encapsulant 160B. In some examples, outer interconnect 140 can be located on the top side of substrate 110 and the top side of encapsulant 160B. In some examples, electronic device 100B can comprise or be referred to as WLFO. In some examples, later in the fabricating process, the RDL substrate and encapsulant 160B can be sawn in a vertical direction such that the lateral sides of the dielectric 120 or conductive tier 130 and the lateral sides of the encapsulant 160B can be coplanar.

FIG. 6 shows a cross-sectional view of an example electronic device 100C. In the example shown in FIG. 6, electronic device 100C can comprise electronic component 170C, dielectrics 120, conductive tiers 130, outer interconnects 140, barrier 150, encapsulant 160C and underfill 180C. Electronic device 100C shown in FIG. 6 can be similar to electronic device 100B shown in FIG. 5 except the RDL substrate can be provided first, followed by electronic component 170C. In some examples, the RDL substrate can comprise dielectric structure 120' and conductive structure 130'.

In some examples, substrate 110 can be removed from the RDL substrate after the process shown in FIG. 2S. In some examples, the RDL substrate can be turned over and electronic component 170C can be attached to the top side of the RLD substrate. In some examples, electronic component 170C can comprise or be referred to as a die, chip, package, or passive element. In some examples, the thickness of electronic component 170C can range from about 20 μm to about 1000 μm. In some examples, component interconnect 171C of electronic component 170C can be electrically coupled with inward terminal 130*d* of the RDL substrate. In some examples, component interconnect 171C can comprise or be referred to as a bump, pad, or pillar. In some examples, the thickness of component interconnect 171C can range from about 1 μm to about 10 μm. In some examples, component interconnect 171C can be electrically coupled on seed 130*a* overlying inward terminal 130*d*. In some examples, component interconnect 171C can be electrically coupled to inward terminal 130*d* via solder. In some examples, component interconnect 171C can be electrically coupled to inward terminal 130*d* by a thermocompression bonding process, an ultrasonic bonding process, or a laser assisted bonding process.

Underfill 180C can be provided between the RDL substrate and electronic component 170C. In some examples, underfill 180C can contact the RDL substrate, for example dielectrics 120 or conductive tiers 130, component interconnect 171C, or electronic component 170C. In some examples, underfill 180C can comprise or be referred to as capillary underfill (CUF), non-conductive pasted (NCP), non-conductive film (NCF), or anisotropic conductive film (ACF). In some examples, underfill 180C can be inserted into a gap between electronic component 170C and the RDL substrate after electronic component 170C is electrically coupled to the RDL substrate. In some examples, underfill 180C can be pre-coated onto the RDL substrate prior to electronic component 170C being coupled to the RDL substrate. Accordingly, electronic component 170C can pressurize underfill 180C, and at the same time, component interconnect 171C can penetrate underfill 180C to be electrically coupled with the RDL substrate. In some examples, underfill 180C can be pre-coated on electronic component 170C prior to electronic component 170C being coupled to the RDL substrate. Accordingly, electronic component 170C can pressurize underfill 1800, and at the same time, component interconnect 171C can be electrically coupled with the RDL substrate. In some examples, a curing process of underfill 180C can be performed, for example a thermal curing process or a photocuring process.

Encapsulant 160C can be provided. In some examples, encapsulant 160C can cover the RDL substrate, electronic component 170C, and underfill 180C. In some examples, encapsulant 160C can contact or cover the RDL substrate, electronic component 170C, and underfill 180C. In some examples, underfill 180C can be omitted, and encapsulant 160C can be filled between electronic component 170C and the RDL substrate. In some examples, when the silica filler has a smaller size than the gap between electronic component 170C and RDL substrate, encapsulant 160C can replace the role of underfill 180C. In some examples, electronic device 100C can comprise or be referred to as HDFO or SWIFT®. In some examples, substrate 110 can comprise electronic component 170C which can comprise a semiconductor die. Electronic component 170C can comprise component interconnect 171C which can be coupled with conductive structure 130. Underfill 180C can be between electronic component 170C and dielectric 120 and can be coupled with component interconnect 171C.

Figure 7:
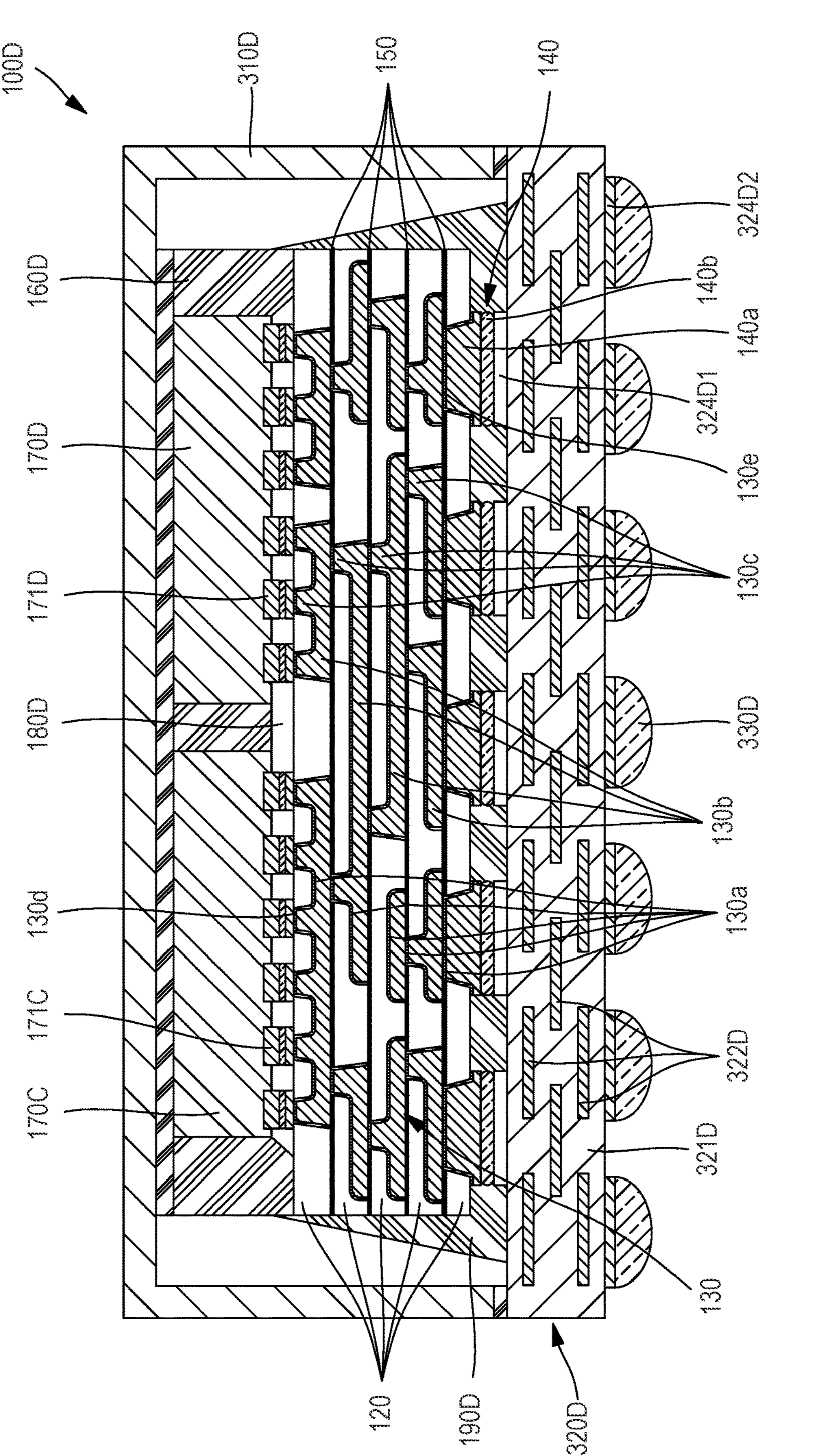
FIG. 7 shows a cross-sectional view of an example electronic device.

FIG. 7 shows a cross-sectional view of an example electronic device 100D. In the example shown in FIG. 7, electronic device 100D can comprise electronic component 170D, dielectrics 120, conductive tiers 130, outer interconnect 140, barrier 150, encapsulant 160D, underfill 180D, 320D, external interconnect 330D, underfill 190D, and heat spreader 310D. Heat spreader 310D can also be referred to as lid 310D. In some examples, a first dielectric 120 and a first conductive tier 130 can be coupled with a second dielectric 120 and a second conductive tier 130. The first conductive tier 130 can be between the top side and the bottom side of the first dielectric 120, and the second conductive tier 130 can be between the top side and the bottom side of the second dielectric 120. Barrier 150 or barrier structure 150' can be between the first dielectric 120 and the second dielectric 120. The second dielectric 120 can be over the first dielectric 120, and electronic component 170D can be coupled with the second conductive tier 130 of the second dielectric 120. Encapsulant 160D can be coupled with the second dielectric 120 and can cover a lateral side of electronic component 170D. The first conductive structure 130 can be coupled with the second conductive structure 130 through an opening in the barrier layer 150 or barrier structure 150. One or more additional dielectrics 120 and one or more additional conductive tiers 130 can be provided following the same pattern or structure as first and second dielectric 120 and the first and second conductive tiers 130.

In some examples, base substrate 320D can comprise base dielectric structure 321D and base conductive structure 322D. In some examples, base dielectric structure 321D can comprise dielectric layers. The dielectric layers can comprise one or more layers of dielectric materials interleaved with the layers of the conductive structures. In some examples, the dielectric materials can comprise PI, BCB, PBO, resin, or ABF. In some examples, base conductive structure 322D can comprise one or more conductive layers defining signal distribution elements, for example traces, vias, pads, conductive paths, or UBM. Base conductive structure 322D can comprise substrate inward terminal 324D1 and substrate outward terminal 324D2. In some examples, substrate inward terminal 324D1 can comprise pads, lands, UBM, or studs. In some examples, substrate outward terminals 324D2 can comprise pads or lands. External interconnect 330D can comprise solder balls, bumps, pad, or pillar. In some examples, land grid array (LGA) can also be possible design.

In some examples, base substrate 320D can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto buildup film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

Outer interconnect 140 of the RDL substrate can be electrically coupled to substrate inward terminal 324D1 of base substrate 320D. In some examples, outer interconnect 140 can be electrically coupled to inward terminal 324D1 by thermal compression bonding, ultrasonic bonding, or laser assisted bonding. In some examples, solder can be interposed between outer interconnect 140 and inward terminal 324D1. In some examples, underfill 190D optionally can be interposed between the RDL substrate and base substrate 320D. In some examples, base substrate 320D can comprise base dielectric structure 321D and base conductive structure 322D. Base conductive structure 322D can be coupled with the first conductive tier 130, for example via substrate inward terminal 324D1 and outer interconnect 140.

In some examples, heat spreader 310D or lid 310D can be attached through a thermal adhesive to base substrate 320D or electronic component 170D. In some examples, the thermal adhesive can also be interposed between encapsulant 160D and heat spreader 310D. Heat spreader 310D can comprise or be referred to as a lid, cover, case, or housing. In some examples, the thickness of heat spreader 310D can range from about 100 μm to about 100 μm. The heat spreader 310D not only can dissipate heat from electronic component 170D, but also can protect the RDL substrate and electronic component 170D from the external environment. Electronic component 170D can include one or more component terminals 171D. In some examples, heat spreader 310D or lid 310D can cover electronic component 170D and can be coupled with base substrate 320D.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:

a first dielectric comprising a first side and a second side;

a first conductive tier in the first dielectric and comprising a first conductive path integral with a first conductive via, wherein the first conductive path and the first conductive via extend between the first side and the second side of the first dielectric;

a second dielectric comprising a first side and a second side;

a first barrier covering the first conductive tier and covering the first dielectric, wherein the first barrier is between the second side of the first dielectric and the first side of the second dielectric; and a first substrate comprising an inward terminal;

wherein:

the first conductive tier comprises a trench barrier coupled with the first dielectric; and the inward terminal is coupled with the first conductive tier.

2. The semiconductor device of claim 1, wherein:

the first dielectric and the second dielectric comprise an organic dielectric material; and the first barrier comprises an inorganic dielectric material.

3. The semiconductor device of claim 1, wherein:

the first barrier is configured to restrict migration of ions of the first conductive tier into the second dielectric.

4. The semiconductor device of claim 1, wherein:

the trench barrier comprises titanium.

5. The semiconductor device of claim 1, wherein:

the first dielectric comprises a single layer of dielectric material; and the first conductive path and the first conductive via are in the single layer of dielectric material.

6. The semiconductor device of claim 1, comprising:

a second conductive tier in the second dielectric and comprising a second conductive path integral with a second conductive via, wherein the second conductive path and the second conductive via extend between the first side and the second side of the second dielectric;

wherein the second conductive tier is coupled with the first conductive tier through an opening in the first barrier.

7. The semiconductor device of claim 6, wherein the second conductive tier comprises:

a first arcuate vertex between a lateral side of the second conductive path and a horizontal side of the second conductive path; and a second arcuate vertex between the horizontal side of the second conductive path and a lateral side of the second conductive via.

8. The semiconductor device of claim 1, wherein:

the first barrier fully covers the first dielectric and partially covers the first conductive tier.

9. The semiconductor device of claim 1, comprising:

an encapsulant coupled with a lateral side of the first substrate and coupled with the first side of the first dielectric.

10. The semiconductor device of claim 9, wherein:

the encapsulant covers a side of the first substrate opposite to the inward terminal.

11. The semiconductor device of claim 1, wherein:

the first substrate comprises a semiconductor die and the inward terminal comprises a component interconnect; and the component interconnect is coupled with the first conductive tier.

12. A semiconductor device, comprising:

a first dielectric comprising a first side and a second side;

a first conductive tier comprising a first conductive path integral with a first conductive via, wherein the first conductive path and the first conductive via extend between the first side and the second side of the first dielectric;

a second dielectric comprising a first side and a second side;

a second conductive tier comprising a second conductive path integral with a second conductive via, wherein the second conductive path and the second conductive via extend between the first side and the second side of the second dielectric;

a first barrier between the second side of the first conductive tier and the first side of the second dielectric;

a first electronic component coupled with the second conductive tier; and a first encapsulant coupled with the second dielectric and covering a lateral side of the first electronic component;

wherein the second conductive tier is coupled with the first conductive tier through an opening in the first barrier; and wherein the second conductive tier comprises:

a first arcuate vertex between a lateral side of the second conductive path and a horizontal side of the second conductive path; and a second arcuate vertex between the horizontal side of the second conductive path and a lateral side of the second conductive via.

13. The semiconductor device of claim 12, comprising:

a base substrate comprising a base dielectric structure and a base conductive structure;

wherein the base conductive structure is coupled with the first conductive tier through a substrate inward terminal.

14. The semiconductor device of claim 13, comprising:

a lid covering the first electronic component and coupled with the base substrate.

15. The semiconductor device of claim 13, comprising:

a third dielectric between the base substrate and the first dielectric;

an outer interconnect extending through the third dielectric; and a second barrier structure between the first conductive tier and the third dielectric;

wherein:

the outer interconnect is coupled with the first conductive tier through an opening in the second barrier structure; and the outer interconnect is coupled with the base conductive structure through the substrate inward terminal.

16. A method to manufacture a semiconductor device, comprising:

providing a substrate comprising a first side and a second side;

providing a first dielectric comprising a first side and a second side, wherein the first side of the first dielectric is coupled with the second side of the substrate;

providing a first conductive tier in the first dielectric and comprising a first conductive path integral with a first conductive via, wherein the first conductive path and the first conductive via extend between the first side of the first dielectric and the second side of the first dielectric;

providing a first barrier covering the first conductive tier and covering the second side of the first dielectric; and providing a second dielectric comprising a first side and a second side, wherein the first side of the second dielectric is coupled with the second side of the first dielectric;

wherein the first barrier is between the second side of the first dielectric and the first side of the second dielectric; and wherein the substrate comprises an inward terminal coupled to the first conductive tier.

17. The method of claim 16, wherein:

providing the first conductive tier comprises:

providing a trench barrier into the first dielectric; and providing the first conductive via and the first conductive path over the trench barrier; and wherein the trench barrier is between the first dielectric and each of the first conductive path and the first conductive via.

18. The method of claim 16, comprising:

providing a second conductive tier in the second dielectric and comprising a second conductive path integral with a second conductive via wherein the second conductive path and the second conductive via extend between the first side of the second dielectric and the second side of the second dielectric;

wherein the second conductive via is coupled with the first conductive tier through an opening in the first barrier.

19. The method of claim 16, wherein:

the first dielectric comprises a single layer of dielectric material; and the first conductive path and the first conductive via are in the single layer of dielectric material.

* * * * *